United States Patent
Yoon (10) Patent No.: US 7,847,396 B2
(45) Date of Patent: Dec. 7, 2010

(54) SEMICONDUCTOR CHIP STACK-TYPE PACKAGE AND METHOD OF FABRICATING THE SAME

(75) Inventor: Sung-Hwan Yoon, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 331 days.

(21) Appl. No.: 12/196,088

(22) Filed: Aug. 21, 2008

(65) Prior Publication Data
US 2009/0051021 A1 Feb. 26, 2009

(30) Foreign Application Priority Data
Aug. 23, 2007 (KR) .................... 10-2007-0085021

(51) Int. Cl.
H01L 23/495 (2006.01)
(52) U.S. Cl. ............... 257/723; 257/686; 257/777; 257/E23.04
(58) Field of Classification Search ........... 257/666, 257/676, 723, 686, 777, E23.04
See application file for complete search history.

(56) References Cited

U.S. PATENT DOCUMENTS 6,690,089 B2 * 2/2004 Uchida ................ 257/686
2002/0130399 A1 * 9/2002 Moon ................... 257/666
2006/0175715 A1 8/2006 Hirose et al.

FOREIGN PATENT DOCUMENTS

| JP | 2003-332521 | 11/2003 |
|----|-------------|---------|
| JP | 2006-216911 | 8/2006 |
| KR | 1999-0060952 | 7/1999 |
| KR | 10-2006-0090173 | 8/2006 |

* cited by examiner

Primary Examiner—Roy K Potter
(74) Attorney, Agent, or Firm—Myers Bigel Sibley & Sajovec, PA (57) ABSTRACT

Embodiments of the inventive concept provide a semiconductor chip stack-type package. The package comprises a lead frame including a die paddle part and a lead part, a first semiconductor chip group and a second semiconductor chip group stacked sequentially and mounted on one surface of the die paddle part, a first wiring board between the first semiconductor chip group and the second semiconductor chip group, and second semiconductor chip group bonding wires for electrically connecting the second semiconductor chip group to the first wiring board. End portions of the first wiring board are electrically connected to inner leads of the lead part, which is adjacent to the die paddle part.

20 Claims, 8 Drawing Sheets

SEMICONDUCTOR CHIP STACK-TYPE PACKAGE AND METHOD OF FABRICATING THE SAME

CROSS-REFERENCE TO RELATED APPLICATIONS

This application claims priority under 35 U.S.C. §119 to Korean Patent Application No. 10-2007-0085021, filed on Aug. 23, 2007, in the Korean Patent Office, the entire contents of which are hereby incorporated by reference.

BACKGROUND OF THE INVENTIVE CONCEPT

The present inventive concept relates to a semiconductor package and method of fabricating the same, and more particularly to a semiconductor chip stack-type package and method of fabricating the same.

As electrical devices are becoming lighter, thinner, shorter and smaller, the level of integration and mounting rate are becoming increasingly important considerations in the design of packages for electrical devices. Also, in computers, the size of installed semiconductor devices, such as Random Access Memory (RAM) devices and flash memory devices, is increasing due to an increase of memory capacity. On the other hand, the size of the package is becoming smaller due to the above reasons.

Various schemes to decrease package size have been introduced including, for example: a stack-type semiconductor package in which a plurality of semiconductor chips or semiconductor device packages are stacked; and a semiconductor module in which a plurality of semiconductor chips, a plurality of semiconductor device packages and/or a plurality of stack-type semiconductor packages are mounted in each level on at least one surface of a Printed Circuit Board (PCB).

These packages may be classified into multi-chip packages (MCP), in which a plurality of semiconductor chips with different functions are mounted (or stacked), and semiconductor chip stack-type packages, such as a quad die package (QDP) and an octad die package (ODP), in which a plurality of semiconductor chips are stacked in order to realize high capacity. In addition, a package in which the above two types are both incorporated is being developed.

Figure 1:
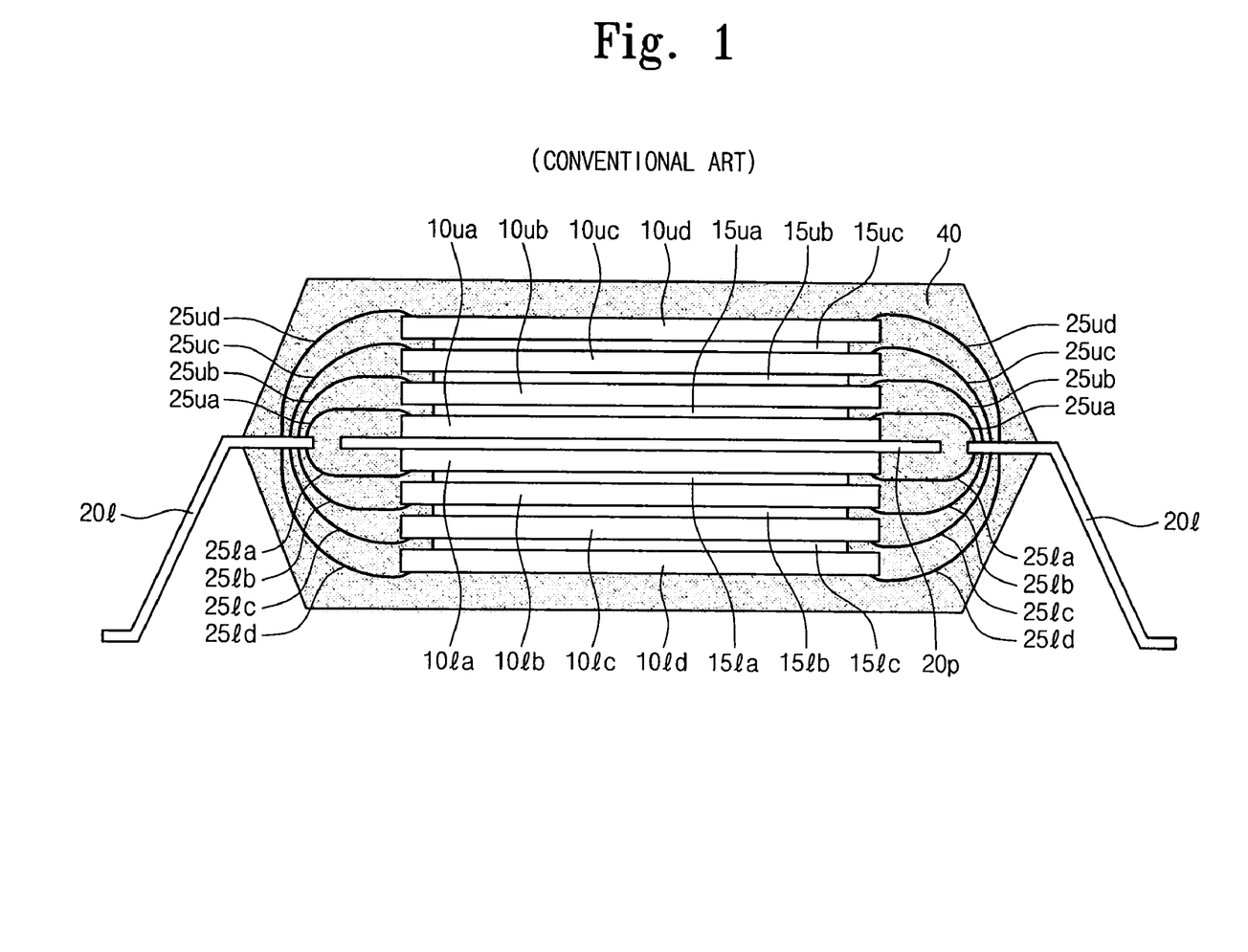
FIG. 1 is a cross-sectional view illustrating a conventional semiconductor chip stack-type package.

FIG. 1 is a cross-sectional view illustrating a conventional semiconductor chip stack-type package.

Referring to FIG. 1, a semiconductor chip stack-type package includes a lead frame, semiconductor chips 10*ua*, 10*ub*, 10*uc*, 10*ud*, 10*la*, 10*lb*, 10*lc* and 10*ld*, bonding wires 25*ua*, 25*ub*, 25*uc*, 25*ud*, 25*la*, 25*lb*, 25*lc* and 25*ld*, and a molded portion 40.

The lead frame includes a die paddle part 20*p* and a lead part 20*l*. The die paddle part 20*p* provides a mounting region for mounting a semiconductor chip. The semiconductor chip is mounted on an upper surface and/or a lower surface of the die paddle part 20*p*. The lead part 20*l* is electrically connected to the semiconductor chips mounted on the die paddle part 20*p* by bonding wires, to provide electrical connection between an external circuit (not shown) such as a Printed Circuit Board (PCB) and the semiconductor chips.

The semiconductor chips 10*ua*, 10*ub*, 10*uc*, 10*ud*, 10*la*, 10*lb*, 10*lc* and 10*ld* include upper semiconductor chips 10*ua*, 10*ub*, 10*uc* and 10*ud* stacked on the upper surface of the die paddle part 20*p* respectively, and lower semiconductor chips 10*la*, 10*lb*, 10*lc* and 10*ld* stacked on the lower surface respectively.

Adhesive material layers (not shown) are included between the upper semiconductor chips 10*ua*, 10*ub*, 10*uc* and 10*ud*, the lower semiconductor chips 10*la*, 10*lb*, 10*lc* and 10*ld* and the die paddle part 20*p* of the lead frame. Also, adhesive material layers (not shown) are further provided between each of the semiconductor chips 10*ua*, 10*ub*, 10*uc*, 10*ud*, 10*la*, 10*lb*, 10*lc* and 10*ld*. The upper semiconductor chips 10*ua*, 10*ub*, 10*uc* and 10*ud* and the lower semiconductor chips 10*la*, 10*lb*, 10*lc* and 10*ld* are mounted on the upper and lower surfaces of the die paddle part 20*p* by means of the adhesive material layers.

Inter-chip material layers 15*ua*, 15*ub*, 15*uc*, 15*la*, 15*lb* and 15*lc* are interposed between the semiconductor chips adjacent to each other included in the semiconductor chips 10*ua*, 10*ub*, 10*uc*, 10*ud*, 10*la*, 10*lb*, 10*lc* and 10*ld*. These inter-chip material layers 15*ua*, 15*ub*, 15*uc*, 15*la*, 15*lb* and 15*lc* between the semiconductor chips are formed to provide space (or height) for the bonding wires 25*ua*, 25*ub*, 25*uc*, 25*ud*, 25*la*, 25*lb*, 25*lc* and 25*ld*. The bonding wires 25*ua*, 25*ub*, 25*uc*, 25*ud*, 25*la*, 25*lb*, 25*c* and 25*ld* electrically connect the semiconductor chips 10*ua*, 10*ub*, 10*uc*, 10*ud*, 10*la*, 10*lb*, 10*lc* and 10*ld* and the lead part 20*l*, respectively.

The bonding wires 25*ua*, 25*ub*, 25*uc*, 25*ud*, 25*la*, 25*lb*, 25*lc* and 25*ld* electrically connect bonding pads (not shown) of each of the semiconductor chips 10*ua*, 10*ub*, 10*uc*, 10*ud*, 10*la*, 10*lb*, 10*lc* and 10*ld* to the lead part 20*l* of lead frame.

The molded portion 40 encapsulates the die paddle part 20*p*, inner leads of the lead part 20*l* adjacent to the die paddle part 20*p*, the semiconductor chips 10*ua*, 10*ub*, 10*uc*, 10*ud*, 10*la*, 10*lb*, 10*lc* and 10*ld*, and the bonding wires 25*ua*, 25*ub*, 25*uc*, 25*ud*, 25*la*, 25*lb*, 25*lc* and 25*ld*. The outer leads of the lead part 20*l*, which are outside of the molded portion 40, function as terminals that electrically connect the semiconductor chip stack-type package to an external circuit.

According to the trend toward higher capacity of electrical devices, when large-sized semiconductor chips are stacked, the above-described semiconductor chip stack-type package has shorter inner leads in a limited package space. Accordingly, it becomes increasingly difficult to provide enough space for bonding wires that electrically connect semiconductor chips and the lead part.

SUMMARY

Exemplary embodiments of the present inventive concept are related to a semiconductor chip stack-type package and method of fabricating the same. In an exemplary embodiment, a semiconductor chip stack-type package may include a lead frame including a die paddle part and a lead part; a first semiconductor chip group and a second semiconductor chip group stacked sequentially and mounted on one surface of the die paddle part; a first wiring board between the first semiconductor chip group and the second semiconductor chip group; and second semiconductor chip group bonding wires for electrically connecting the second semiconductor chip group to the first wiring board, wherein end portions of the first wiring board are electrically connected to inner leads of the lead part which are adjacent to the die paddle part.

BRIEF DESCRIPTION OF THE DRAWINGS

The accompanying drawings are included to provide a further understanding of the inventive concept, and are incorporated in and constitute a part of this specification. The drawings illustrate example embodiments of the present inventive concept and, together with the description, serve to explain principles of the present inventive concept. In the drawings.

DETAILED DESCRIPTION OF THE EMBODIMENTS

Embodiments of the present inventive concept will now be described more fully hereinafter with reference to the accompanying drawings, in which embodiments of the inventive concept are shown. This inventive concept, however, may be embodied in many different forms and should not be construed as limited to the embodiments set forth herein. Rather, these embodiments are provided so that this disclosure will be thorough and complete, and will fully convey the scope of the inventive concept to those skilled in the art. Any element in a claim that does not explicitly state "means for" performing a specified function, or "step for" performing a specific function, is not to be interpreted as a "means" or "step" clause as specified in 35 U.S.C. §112, paragraph 6. In particular, the use of "step of" in the claims herein is not intended to invoke the provisions of 35 U.S.C. §112, paragraph 6. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

Figure 2:
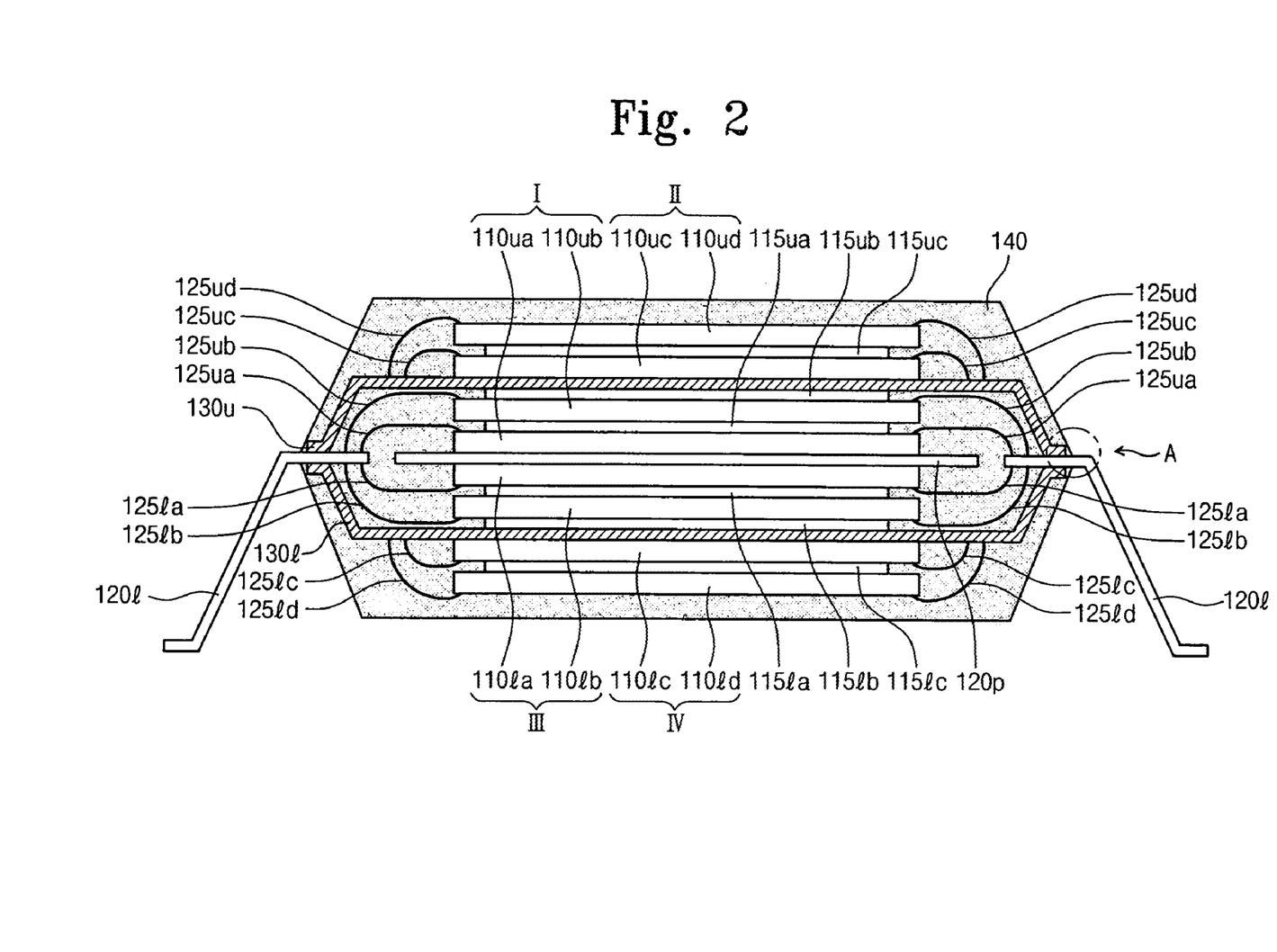
FIG. 2 is a cross-sectional view illustrating an exemplary semiconductor chip stack-type package according to an embodiment of the present inventive concept.
Figure 3A:
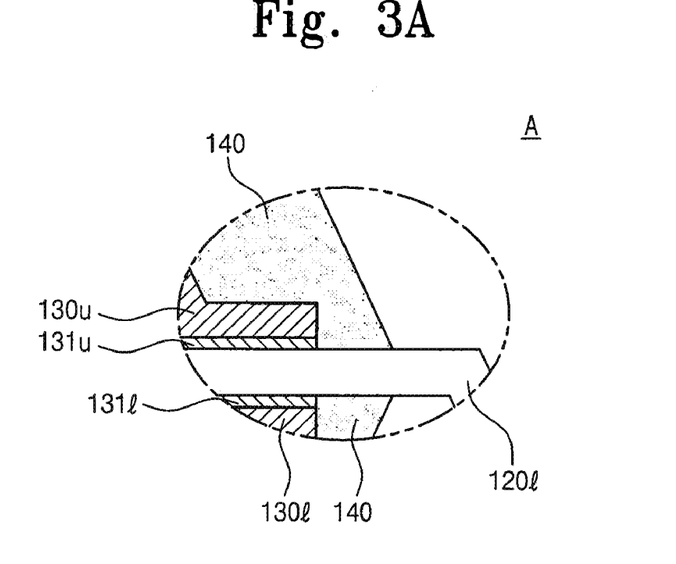
FIGS. 3A and 3B are enlarged cross-sectional views of alternate implementations of portion A of FIG. 2.
Figure 3B:
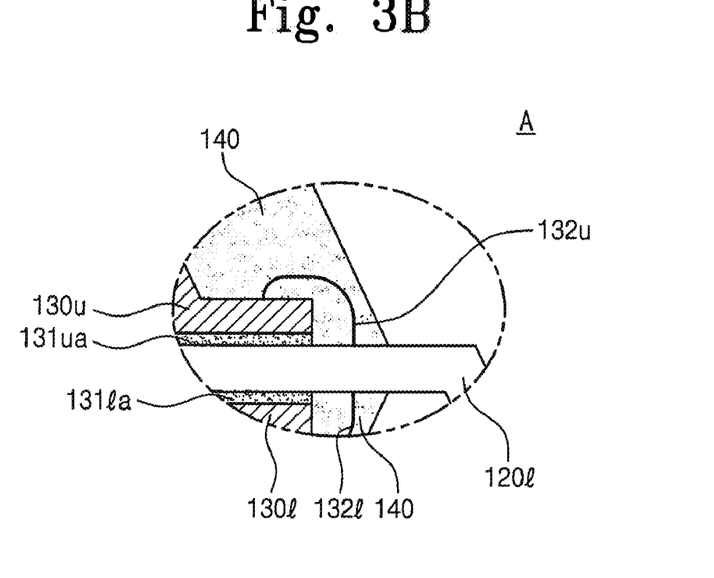

FIG. 2 is a cross-sectional view illustrating a semiconductor chip stack-type package according to an exemplary embodiment of the present inventive concept, and FIG. 3A and FIG. 3B are enlarged cross-sectional views of portion A of FIG. 2, respectively.

Referring to FIG. 2, a semiconductor chip stack-type package may include a lead frame, semiconductor chip groups I, II, III and IV, wiring boards $130u$ and $130l$, bonding wires $125ua$, $125ub$, $125uc$, $125ud$, $125la$, $125lb$, $125lc$ and $125ld$, and a molded portion $140$.

The lead frame may include a die paddle part $120p$ and a lead part $120l$. The die paddle part $120p$ may include a mounting region for mounting the semiconductor chips. The semiconductor chips may be mounted on an upper surface and/or a lower surface of the die paddle part $120p$. The lead part $120l$ may be electrically connected to the semiconductor chips mounted in the die paddle part $120p$ by means of bonding wires, to provide electrical connection between an external circuit (not shown) such as a Printed Circuit Board (PCB) and the semiconductor chips.

Each of the semiconductor chip groups I, II, III and IV may include at least one semiconductor chip. The first semiconductor chip group I may include a first upper semiconductor chip $110ua$ and a second upper semiconductor chip $110ub$ sequentially stacked on the upper surface of the die paddle part $120p$ of the lead frame. The second semiconductor chip group II may include a third upper semiconductor chip $110uc$ and a fourth upper semiconductor chip $110ud$ sequentially stacked on an upper wiring board $130u$, the upper wiring board $130u$ being interposed between the first semiconductor chip group I and the second semiconductor chip group II. The third semiconductor chip group III may include a first lower semiconductor chip $110la$ and a second lower semiconductor chip $110lb$ sequentially stacked on the lower surface of the die paddle part $120p$ of the lead frame. The fourth semiconductor chip group IV may include a third lower semiconductor chip $110lc$ and a fourth lower semiconductor chip $110ld$ sequentially stacked on a lower wiring board $130l$, the lower wiring board $130l$ being interposed between the third semiconductor chip group III and the fourth semiconductor chip group IV.

Adhesive material layers (not shown) may be provided between the first semiconductor chip group I, the third semiconductor chip group III and the die paddle part $120p$ of the lead frame. Also, adhesive material layers may be further provided between the second semiconductor chip group II, the fourth semiconductor chip group IV and the wiring boards $130u$ and $130l$, respectively. By means of the adhesive material layers, the first semiconductor chip group I and the third semiconductor chip group III may be mounted on the upper and lower surfaces of the die paddle part $120$, and the second semiconductor chip group II and the fourth semiconductor chip group IV may be mounted on the wiring boards $130u$ and $130l$, respectively.

The wiring boards $130u$ and $130l$ may include the upper wiring board $130u$ interposed between the first and second semiconductor chip groups I and II, and the lower wiring board $130l$ interposed between the third and fourth semiconductor chip groups III and IV. The wiring boards $130u$ and $130l$ may include bent end portions which electrically connect to the lead part $120l$ of the lead frame. The wiring boards $130u$ and $130l$ may include one selected from a flexible circuit board, a rigid circuit board, or a circuit board with both flexible and rigid characteristics. The bent end portions of the wiring boards $130u$ and $130l$ may be made by bending the circuit boards. The bent end portions of the wiring boards $130u$ and $130l$ may be gull-wing shaped, similar to the shape of outer leads of the lead part $120l$ of the lead frame.

The wiring boards $130u$ and $130l$ may be adhered by means of adhesive materials (not shown) interposed between the end portions of the wiring boards $130u$ and $130l$ and the lead part $120l$. A detailed description on the physical/electrical connection between the wiring boards $130u$ and $130l$ and the lead part $120l$ is provided below with reference to FIG. 3A and/or FIG. 3B.

If each of the semiconductor chip groups I, II, III and IV includes a plurality of semiconductor chips as shown in FIG. 2, inter-chip material layers $115ua$, $115uc$, $115la$ and $115lc$ may be interposed between the semiconductor chips included in the semiconductor chip groups I, II, III and IV. Also, spacer material layers $115ub$ and $115lb$ may be interposed between the first semiconductor chip group I, third semiconductor chip group III and the wiring boards $130u$ and $130l$, respectively. The inter-chip material layers $115ua$, $115uc$, $115la$ and $115lc$ and the spacer material layers $115ub$ and $115lb$ may include a non-conductive material. Also, the inter-chip material layers $115ua$, $115uc$, $115la$ and $115lc$ and the spacer material layers $115ub$ and $115lb$ may have adhesive characteristics. These inter-chip material layers $115ua$, $115uc$, $115la$ and $115lc$ and spacer material layers $115ub$ and $115lb$ may be formed to provide space (or height) for the bonding wires $125ua$, $125ub$, $125uc$, $125ud$, $125la$, $125lb$, $125lc$ and $125ld$, which electrically connect the semiconductor chip groups I, II, III, and IV, the lead part $120l$ and the wiring boards $130u$ and $130l$, respectively.

The bonding wires $125ua$, $125ub$, $125uc$, $125ud$, $125la$, $125lb$, $125lc$ and $125ld$ may include first semiconductor chip group bonding wires $125ua$ and $125ub$, second semiconductor chip group bonding wires $125uc$ and $125ud$, third semiconductor chip group bonding wires 125*la* and 125*lb*, and fourth semiconductor chip group bonding wires 125*lc* and 125*ld*.

The first semiconductor chip group bonding wires 125*ua* and 125*ub* may electrically connect bonding pads (not shown) of respective first upper semiconductor chip 110*ua* and second upper semiconductor chip 110*ub* of the first semiconductor chip group I, with the lead part 120*l* of the lead frame. The second semiconductor chip group bonding wires 125*uc* and 125*ud* may electrically connect bonding pads of respective third upper semiconductor chip 110*uc* and fourth upper semiconductor chip 110*ud* of the second semiconductor chip group II, with the upper wiring board 130*u*. The third semiconductor chip group bonding wires 125*la* and 125*lb* may electrically connect bonding pads of respective first lower semiconductor chip 110*la* and second lower semiconductor chip 110*lb*, with the lead part 120*l* of the lead frame. The fourth semiconductor chip group bonding wires 125*lc* and 125*ld* may electrically connect bonding pads of respective third lower semiconductor chip 110*lc* and fourth lower semiconductor chip 110*ld*, with the lower wiring board 130*l*.

The molded portion 140 may encapsulate the die paddle part 120*p*, inner leads of the lead part 120*l* adjacent to the die paddle part 120*p*, the semiconductor chip groups I, II, III and IV, the wiring boards 130*u* and 130*l*, and the bonding wires 125*ua*, 125*ub*, 125*uc*, 125*ud*, 125*la*, 125*lb*, 125*lc* and 125*ld*. The molded portion 140 may include epoxy molding compound (EMC). The outer leads of the lead part 120*l* disposed outside of the molded portion 140 may function as terminals for electrically connecting the semiconductor chip stack-type package to an external circuit. The outer leads of the lead part 120*l* may be gull-wing shaped.

Although not shown, the semiconductor chip stack-type package according to some embodiments of the present inventive concept may further include a second upper wiring board (not shown) disposed on the second semiconductor chip group II, a fifth semiconductor chip group (not shown) mounted on the second upper wiring board, fifth semiconductor chip group bonding wires electrically connecting the fifth semiconductor chip group to the second upper wiring board, a second lower wiring board (not shown) disposed on the fourth semiconductor chip group IV, a sixth semiconductor chip group (not shown) mounted on the second lower wiring board and sixth semiconductor chip group bonding wires electrically connecting the sixth semiconductor chip group and the second lower wiring board. Also, an end portion of each of the second upper wiring board and the second lower wiring board may be electrically connected to the inner leads of the lead part 120*l*.

The above-described semiconductor chip stack-type package may provide more space for bonding wires in a limited package size, as opposed to the conventional art. In other words, mounting and stacking high-capacity semiconductor chips may be possible. Accordingly, high-capacity semiconductor packages may be manufactured.

Referring to FIG. 3A, the wiring boards 130*u* and 130*l* may be electrically connected to the inner leads of the lead part 120*l* of the lead frame, the lead frame being encapsulated by the molded portion 140. The electrical connection between the end portions of the wiring boards 130*u* and 130*l* and the lead part 120*l* may be provided by adhesive members 131*u* and 131*l*. The adhesive members 131*u* and 131*l* may include a conductive material. The adhesive members 131*u* and 131*l* may be one selected from adhesion film type adhesives, soldering type adhesives, or bump type adhesives. The adhesive members 131*u* and 131*l* of FIG. 3A may be a conductive adhesion film.

In other words, the wiring boards 130*u* and 130*l* may be configured to be disposed, by means of the adhesive members 131*u* and 131*l*, between the first semiconductor chip group (see I of FIG. 2) and the second semiconductor chip group (see II of FIG. 2); and between the third semiconductor chip group (see III of FIG. 2) and the fourth semiconductor chip group (see IV of FIG. 2). At the same time, the wiring boards 130*u* and 130*l* may be electrically connected to the lead part 120*l*.

Referring to FIG. 3B, the wiring boards 130*u* and 130*l* may be electrically connected to the inner leads of the lead part 120*l* of the lead frame, the lead frame being encapsulated by the molded portion 140. The electrical connection between the end portions of the wiring boards 130*u* and 130*l* and the lead part 120*l* may be provided by wiring board bonding wires 132*u* and 132*l*, which are connected to the end portions of the wiring boards 130*u* and 130*l*, and the inner leads of the lead part 120*l*, respectively. In the case where the wiring boards 130*u* and 130*l* and the lead part 120*l* are electrically connected by means of the wiring board bonding wires 132*u* and 132*l*, adhesive members 131*ua* and 131*la* may include a non-conductive material. The adhesive members 131*ua* and 131*la* may be an adhesion film type adhesive. The adhesive members 131*ua* and 131*la* shown in FIG. 3B may be a non-conductive adhesion film type adhesive.

In other words, the wiring boards 130*u* and 130*l* may be configured to be disposed, by means of the adhesive members 131*ua* and 131*la*, between the first semiconductor chip group (see I of FIG. 2) and the second semiconductor chip group (see II of FIG. 2); and between the third semiconductor chip group (see III of FIG. 2) and the fourth semiconductor chip group (see IV of FIG. 2). At the same time, the wiring boards 130*u* and 130*l* may be electrically connected to the lead part 120*l*, by means of the wiring board bonding wires 132*u* and 132*l*.

FIGS. 4A to 4E are cross-sectional views illustrating a method of fabricating a semiconductor chip stack-type package according to an exemplary embodiment of the present inventive concept.

Figure 4A:
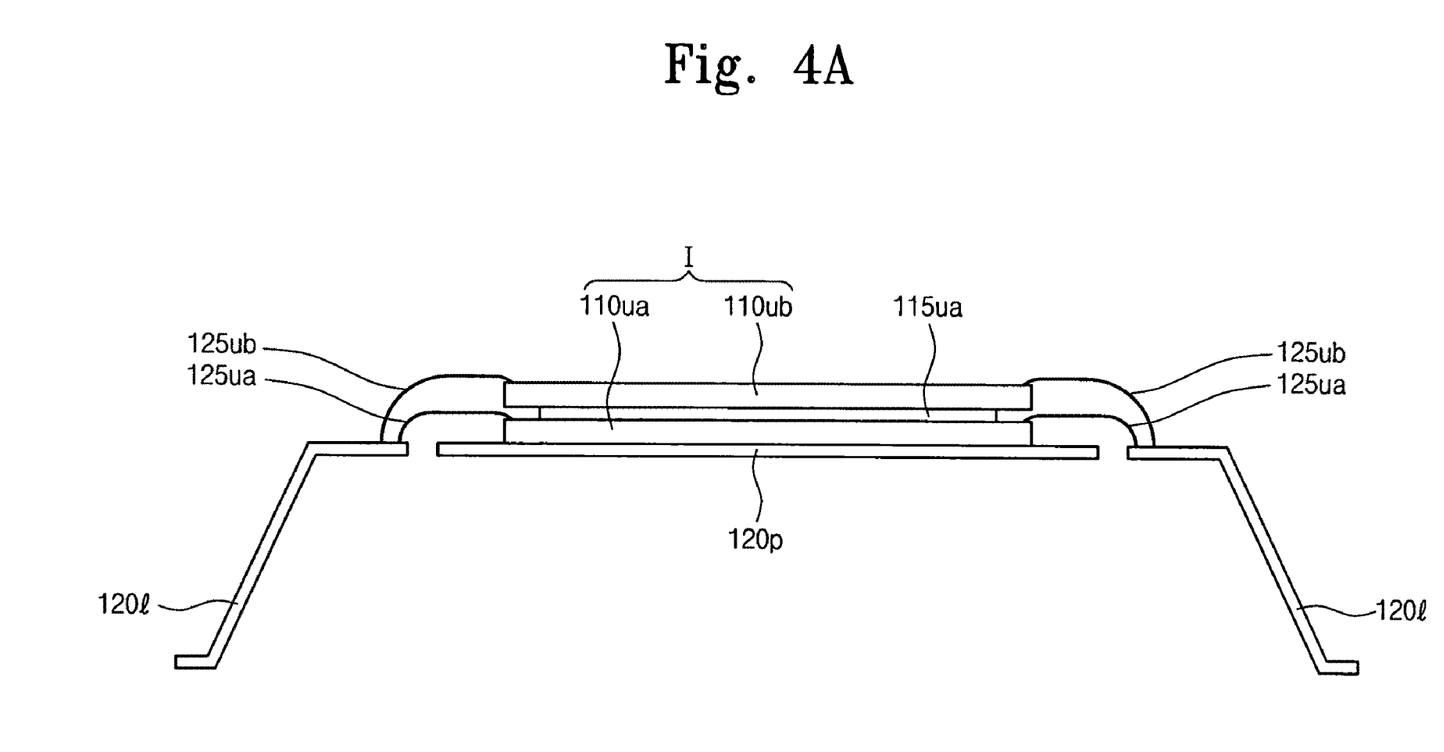
FIGS. 4A to 4E are cross-sectional views illustrating a method of fabricating a semiconductor chip stack-type package according to an exemplary embodiment of the present inventive concept.

Referring to FIG. 4A, a lead frame including a die paddle part 120*p* and a lead part 120*l* is provided. A first semiconductor chip group I may be mounted on an upper surface of the die paddle part 120*p*, the first semiconductor chip group I including a first upper semiconductor chip 110*ua* and a second upper semiconductor chip 110*ub* sequentially stacked. An adhesive material layer (not shown) may be further provided between the first semiconductor chip group I and the die paddle part 120*p*. The first semiconductor chip group I may be mounted on the upper surface of the die paddle part 120*p* by means of the adhesive material layer. Also, the second upper semiconductor chip 110*ub* may be stacked on the first upper semiconductor chip 110*ua* by means of an adhesive material layer.

A first inter-chip material layer 115*ua* may be interposed between the first upper semiconductor chip 110*ua* and the second upper semiconductor chip 110*ub*. The first inter-chip material layer 115*ua* may include a non-conductive material. Also, the first inter-chip material layer 115*ua* may have an adhesive characteristic. The first inter-chip material layer 115*ua* may be disposed to provide space (or height) for forming first semiconductor chip group bonding wires 125*ua* and 125*ub*. The first semiconductor chip group bonding wires 125*ua* and 125*ub* may be used to electrically connect bonding pads (not shown) of the first upper semiconductor chip 110*ua* and the second upper semiconductor chip 110*ub* to the lead part 120*l* of the lead frame.

Figure 4B:
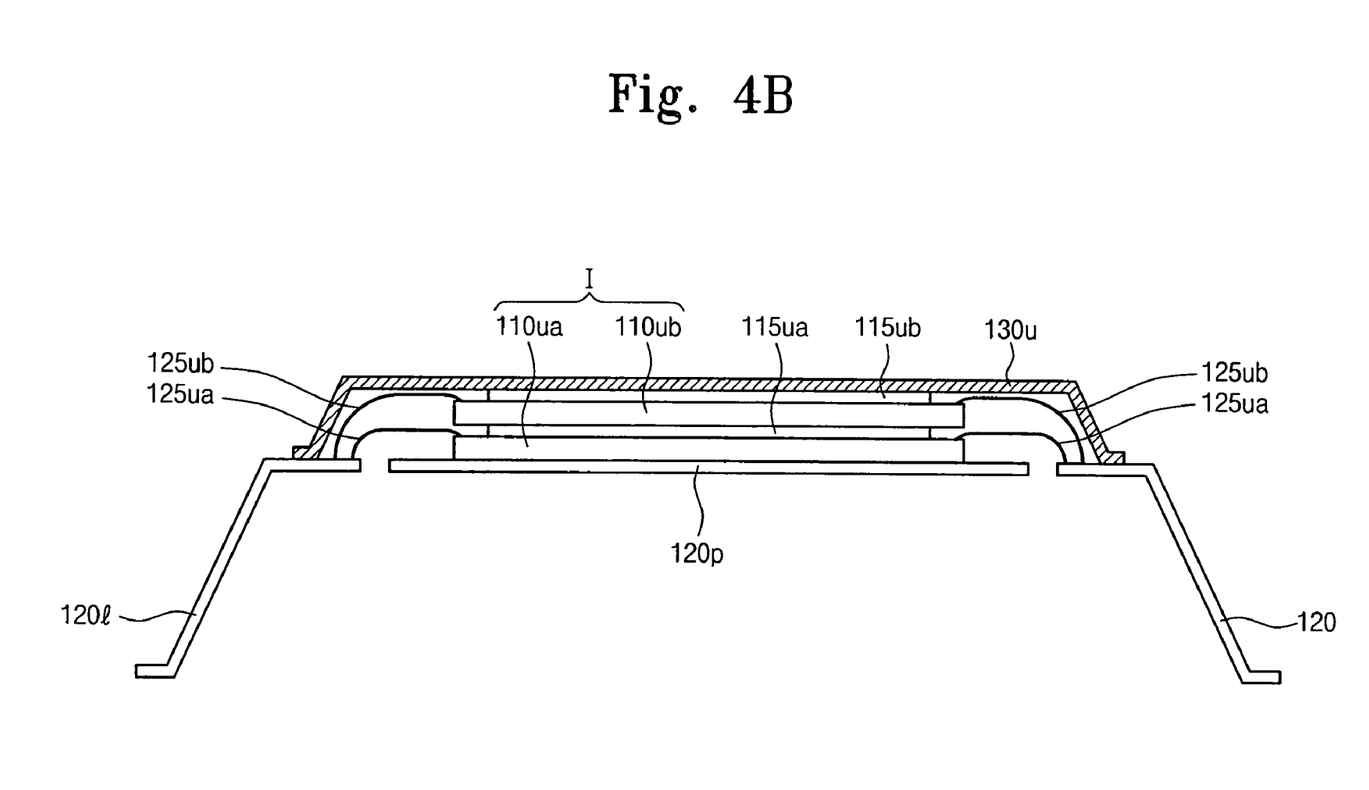

Referring to FIG. 4B, an upper wiring board 130u may be disposed on the first semiconductor chip group I. When the upper wiring board 130u is disposed, adhesive members (see 131u of FIGS. 3A and/or 131ua of FIG. 3B) may also be formed, interposed between an end portion of the upper wiring board 130u and the lead part 120l.

An upper spacer material layer 115ub may be interposed between the first semiconductor chip group I and the upper wiring board 130u. The upper spacer material layer 115ub may include a non-conductive material. Also, the upper spacer material layer 115ub may have an adhesive characteristic. The upper spacer material layer 115ub may be disposed to provide space (or height) for forming first semiconductor chip group bonding wires 125ua and 125ub. The first semiconductor chip group bonding wires 125ua and 125ub may be used to electrically connect bonding pads (not shown) of the first upper semiconductor chip 110ua and the second upper semiconductor chip 110ub to the lead part 120l of the lead frame.

Figure 4C:
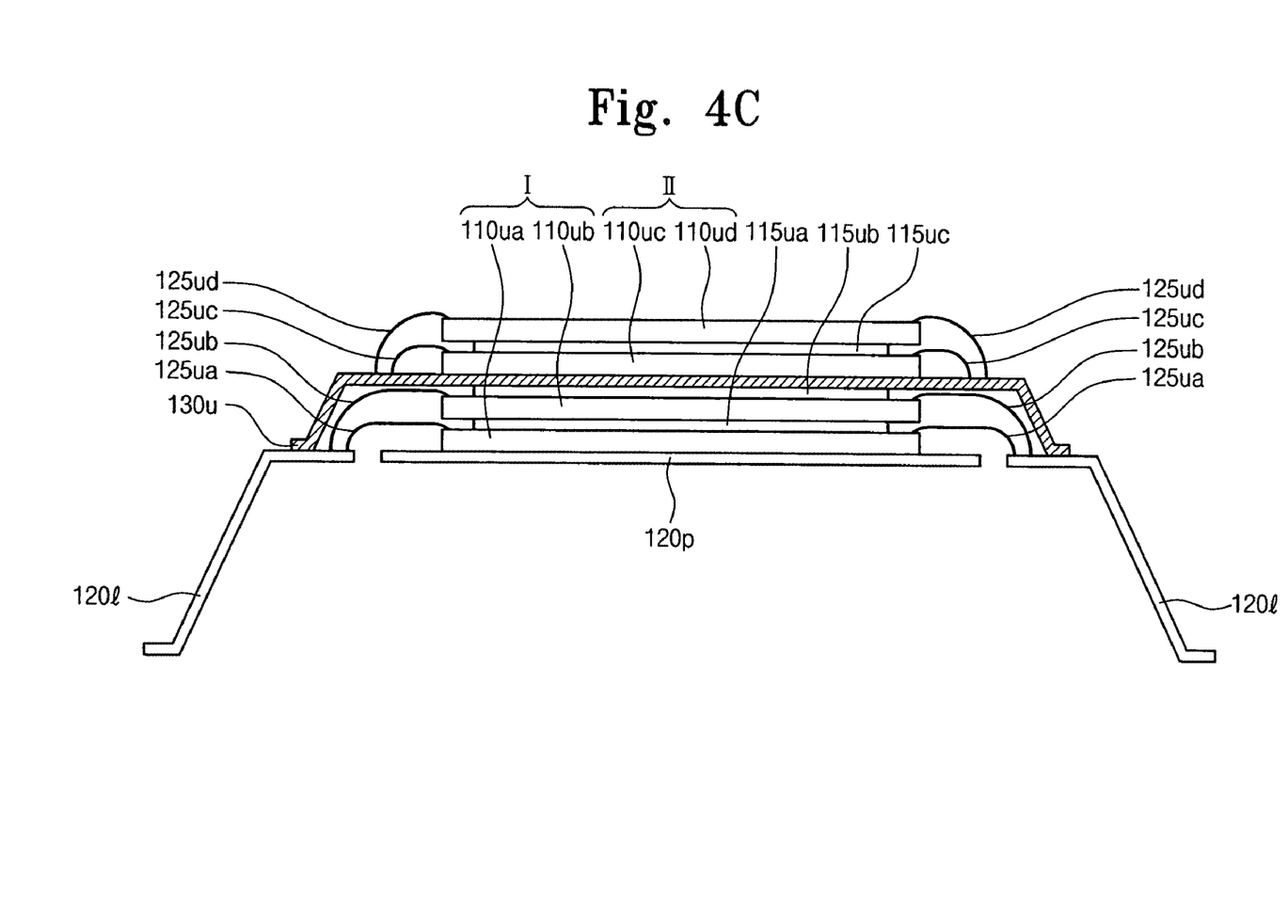

Referring to FIG. 4C, a second semiconductor chip group II may be mounted on the upper wiring board 130u, the second semiconductor chip group II on which a third upper semiconductor chip 110uc and a fourth upper semiconductor chip 110ud are stacked respectively. An adhesive material layer (not shown) may be further provided between the second semiconductor chip group II and the upper wiring board 130u. The second semiconductor chip group II may be mounted on the upper wiring board 130u by means of the adhesive material layer. Also, the fourth upper semiconductor chip 110ud may be stacked on the third upper semiconductor chip 110uc by means of an adhesive material layer.

A second inter-chip material layer 115uc may be interposed between the third upper semiconductor chip 110uc and the fourth upper semiconductor chip 110ud. The second inter-chip material layer 115uc may include a non-conductive material. Also, the second inter-chip material layer 115uc may have an adhesive characteristic. The second inter-chip material layer 115uc may be made to provide space (or height) for forming second semiconductor chip group bonding wires 125uc and 125ud. The second semiconductor chip group bonding wires 125uc and 125ud may be used to electrically connect bonding pads (not shown) of the third upper semiconductor chip 110uc and the fourth upper semiconductor chip 110ud to the lead part 120l of the lead frame.

Figure 4D:
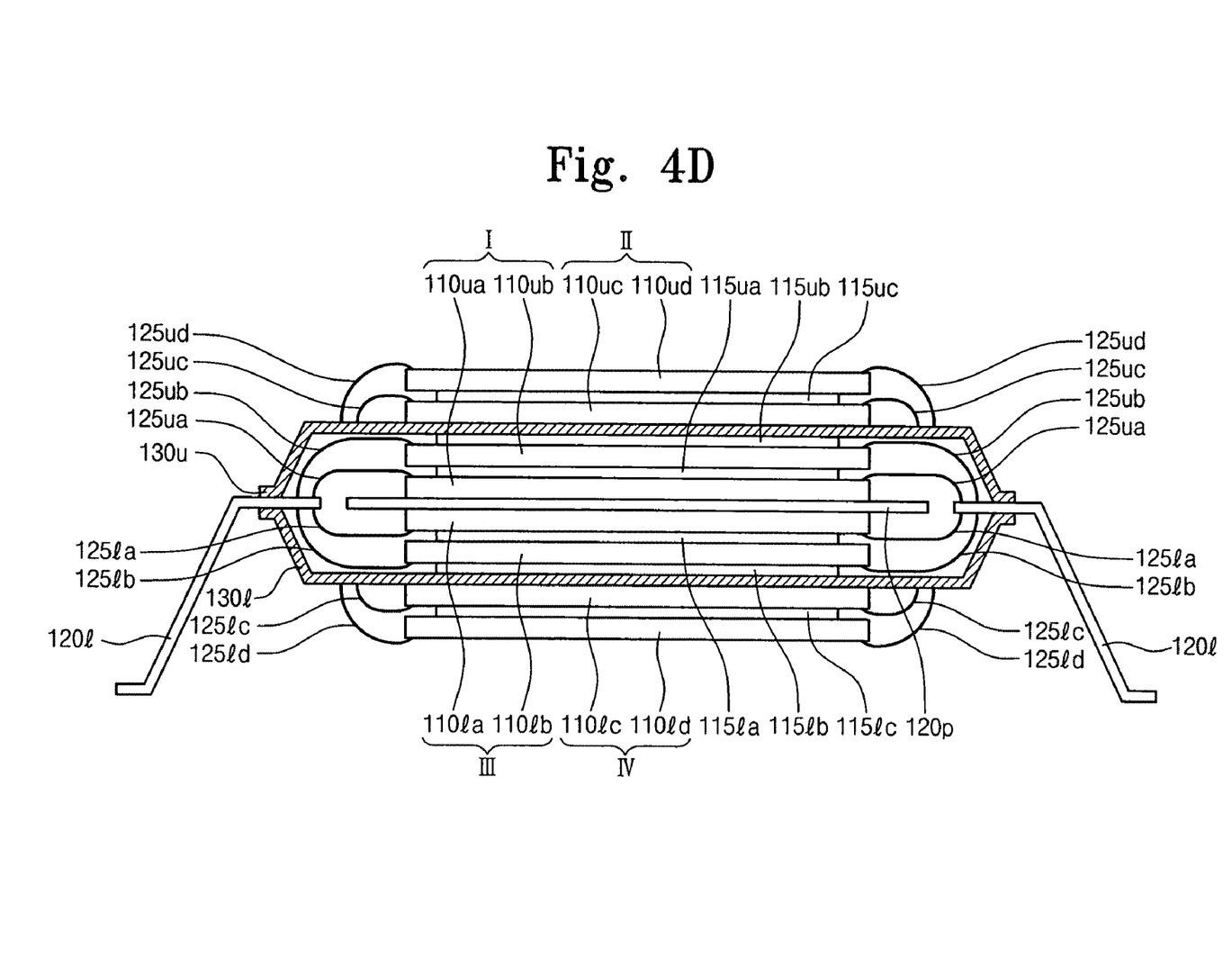

Referring to FIG. 4D, a third semiconductor chip group III may be mounted on a lower surface of the die paddle part 120p, the third semiconductor chip group III including a first lower semiconductor chip 110la and a second lower semiconductor chip 110lb sequentially stacked. An adhesive material layer (not shown) may be further provided between the third semiconductor chip group III and the die paddle part 120p. The third semiconductor chip group III may be mounted on the lower surface of the die paddle part 120p by means of the adhesive material layer. Also, the second lower semiconductor chip 110lb may be stacked on the first lower semiconductor chip 110la by means of an adhesive material layer.

A third inter-chip material layer 115la may be interposed between the first lower semiconductor chip 110la and the second lower semiconductor chip 110lb. The third inter-chip material layer 115la may include a non-conductive material. Also, the third inter-chip material layer 115la may have an adhesive characteristic. The third inter-chip material layer 115la may be disposed to provide space (or height) for forming third semiconductor chip group bonding wires 125la and 125lb. The third semiconductor chip group bonding wires 125la and 125lb may be used to electrically connect bonding pads (not shown) of the first lower semiconductor chip 110la and the second lower semiconductor chip 110lb to the lead part 120l of the lead frame.

A lower wiring board 130l may be disposed on the third semiconductor chip group III. When the lower wiring board 130l is disposed, adhesive members (see 131l of FIG. 3A and/or 131la of FIG. 3B) may also be formed, interposed between an end portion of the lower wiring board 130l and the lead part 120l.

A lower spacer material layer 115lb may be interposed between the third semiconductor chip group III and the lower wiring board 130l. The lower spacer material layer 115lb may include a non-conductive material. Also, the lower spacer material layer 115lb may have an adhesive characteristic. The lower spacer material layer 115lb may be disposed to provide space (or height) for forming third semiconductor chip group bonding wires 125la and 125lb. The third semiconductor chip group bonding wires 125la and 125lb may be used to electrically connect bonding pads (not shown) of the first lower semiconductor chip 110la and the second lower semiconductor chip 110lb to the lead part 120l of the lead frame.

A fourth semiconductor chip group IV may be mounted on the lower wiring board 130l, the fourth semiconductor chip group IV including a third lower semiconductor chip 110lc and a fourth lower semiconductor chip 110d sequentially stacked. An adhesive material layer (not shown) may be further provided between the fourth semiconductor chip group IV and the lower wiring board 130l. The fourth semiconductor chip group IV may be mounted on the lower wiring board 130l by means of the adhesive material layer. Also, the fourth lower semiconductor chip 110d may be stacked on the third lower semiconductor chip 110lc by means of an adhesive material layer.

A fourth inter-chip material layer 115lc may be interposed between the third lower semiconductor chip 110lc and the fourth lower semiconductor chip 110ld. The fourth inter-chip material layer 115lc may include a non-conductive material. Also, the fourth inter-chip material layer 115lc may have an adhesive characteristic. The fourth inter-chip material layer 115lc may be disposed to provide space (or height) for forming fourth semiconductor chip group bonding wires 125lc and 125ld. The fourth semiconductor chip group bonding wires 125lc and 125ld may be used to electrically connect bonding pads (not shown) of the third lower semiconductor chip 110lc and the fourth lower semiconductor chip 110ld to the lead part 120l of the lead frame.

The order of stacking the semiconductor chip groups I, II, III and IV may include different orders of stacking from that illustrated with reference to FIGS. 4A and 4B, such as stacking the first semiconductor chip group, the third semiconductor chip group, the second semiconductor chip group, and the fourth semiconductor chip group, respectively.

Although not shown, the method of fabricating the semiconductor chip stack-type package may further include: disposing a second upper wiring board (not shown) on the second semiconductor chip group II; mounting a fifth semiconductor chip group (not shown) on the second upper wiring board; forming fifth semiconductor chip group bonding wires which electrically connect the fifth semiconductor chip group to the second upper wiring board; disposing a second lower wiring board (not shown) on the fourth semiconductor chip group IV; mounting a sixth semiconductor chip group (not shown) on the second lower wiring board; and forming sixth semiconductor chip group bonding wires which electrically connect the sixth semiconductor chip group to the second lower wiring board. Also, each end portion of the second upper wiring board and the second lower wiring board may be electrically connected to inner leads of the lead part 120*l*.

Figure 4E:
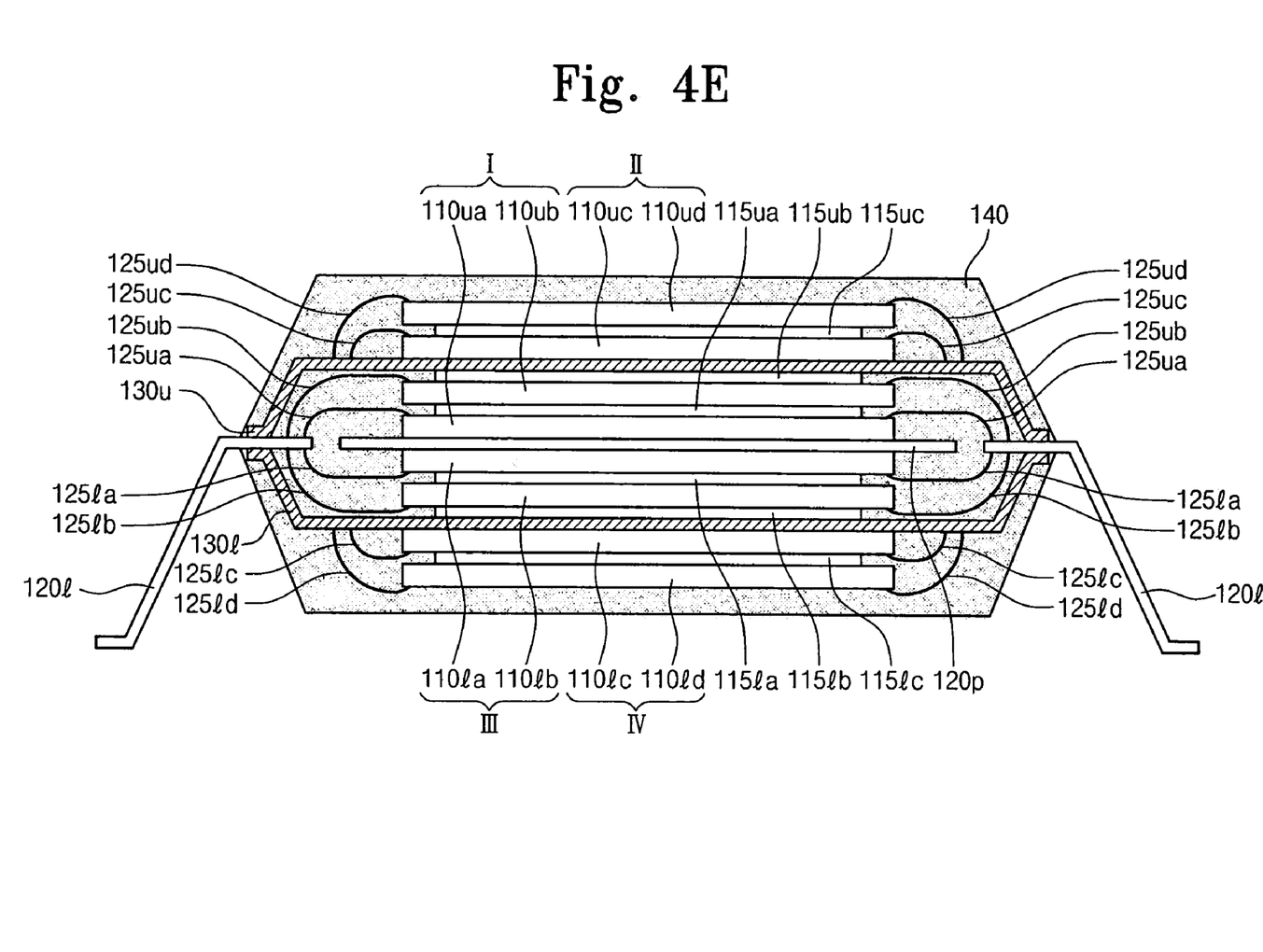

Referring to FIG. 4E, a molded portion 140, which encapsulates the die paddle part 120*p*, the inner leads of the lead part 120*l* adjacent to the die paddle part 120*p*, the semiconductor chip groups I, II, III and IV, wiring boards 130*u* and 130*l*, and the bonding wires 125*ua*, 125*ub*, 125*uc*, 135*ud*, 125*la*, 125*lb*, 125*lc* and 125*ld*, is formed. The molded portion 140 may include an Epoxy Molding Compound (EMC).

The semiconductor chip stack-type package fabricated according to the above method is capable of providing more space for bonding wires in a limited size of package, when compared to the conventional art. In other words, it may be possible for high-capacity semiconductor chips to be mounted and stacked. Accordingly, high-capacity semiconductor packages may be fabricated.

The semiconductor chip stack-type package according to exemplary embodiments of the present inventive concept can mount semiconductor chip groups and include a wiring board in which bonding wires may be connected, the bonding wires for electrical connection with the semiconductor chip group. As a result, space for bonding wires may be provided in inner leads of a short length. Accordingly, a semiconductor chip stack-type package capable of mounting and stacking high-capacity semiconductor chips and a method of fabricating the same are provided.

Exemplary embodiments of the present inventive concept are related to a semiconductor chip stack-type package and method of fabricating the same. In an exemplary embodiment, a semiconductor chip stack-type package may include a lead frame including a die paddle part and a lead part; a first semiconductor chip group and a second semiconductor chip group stacked sequentially and mounted on one surface of the die paddle part; a first wiring board between the first semiconductor chip group and the second semiconductor chip group; and second semiconductor chip group bonding wires electrically connecting the second semiconductor chip group to the first wiring board, wherein end portions of the first wiring board are electrically connected to inner leads of the lead part which are adjacent to the die paddle part.

In another exemplary embodiment, a method of fabricating a semiconductor chip stack-type package may include: preparing a lead frame including a die paddle part and a lead part; mounting a first semiconductor chip group on one surface of the die paddle part; disposing a first wiring board on the first semiconductor chip group; mounting a second semiconductor chip group on the first wiring board; and forming second semiconductor chip group bonding wires which electrically connect the second semiconductor chip group to the first wiring board, wherein end portions of the first wiring board are electrically connected to inner leads of the lead part which are adjacent to the die paddle part.

Although the present inventive concept has been described in connection with the embodiment of the present inventive concept illustrated in the accompanying drawings, it is not limited thereto. It will be apparent to those skilled in the art that various substitutions, modifications and changes may be made thereto without departing from the scope and spirit of the inventive concept.

What is claimed is:

1. A semiconductor chip stack-type package comprising:
   a lead frame including a die paddle part and a lead part;
   a first semiconductor chip group and a second semiconductor chip group stacked on a first surface of the die paddle part;
   a first wiring board disposed between the first semiconductor chip group and the second semiconductor chip group; and
   second semiconductor chip group bonding wires electrically connecting the second semiconductor chip group to the first wiring board,
   wherein an end portion of the first wiring board is electrically connected to inner leads of the lead part.

2. The semiconductor chip stack-type package as claimed in claim 1, further comprising:
   a first adhesive member disposed between the inner leads of the lead part and the end portion of the first wiring board.

3. The semiconductor chip stack-type package as claimed in claim 2, wherein the first adhesive member includes a conductive material.

4. The semiconductor chip stack-type package as claimed in claim 2, further comprising:
   first wiring board bonding wires electrically connecting the end portion of the first wiring board and the inner leads of the lead part, wherein the first adhesive member includes a non-conductive material.

5. The semiconductor chip stack-type package as claimed in claim 1, further comprising:
   first semiconductor chip group bonding wires electrically connecting the first semiconductor chip group to the inner leads of the lead part.

6. The semiconductor chip stack-type package as claimed in claim 1, further comprising:
   a first spacer material layer between the first semiconductor chip group and the first wiring board.

7. The semiconductor chip stack-type package as claimed in claim 1, wherein each of the first semiconductor chip group and the second semiconductor chip group include at least one semiconductor chip.

8. The semiconductor chip stack-type package as claimed in claim 1, further comprising:
   a third semiconductor chip group and a fourth semiconductor chip group stacked on a second surface of the die paddle part;
   a second wiring board disposed between the third semiconductor chip group and the fourth semiconductor chip group; and
   fourth semiconductor chip group bonding wires electrically connecting the fourth semiconductor chip group to the second wiring board,
   wherein an end portion of the second wiring board is electrically connected to the inner leads of the lead part.

9. The semiconductor chip stack-type package as claimed in claim 8, further comprising:
   a second adhesive member disposed between the end portion of the second wiring board and the inner leads of the lead part.

10. The semiconductor chip stack-type package as claimed in claim 9, wherein the second adhesive member includes a conductive material.

11. The semiconductor chip stack-type package as claimed in claim 9, further comprising:
    second wiring board bonding wires electrically connecting the end portion of the second wiring board and the inner leads of the lead part, wherein the second adhesive member includes a non-conductive material.

12. The semiconductor chip stack-type package as claimed in claim 8, further comprising:
    third semiconductor chip group bonding wires electrically connecting the third semiconductor chip group to the inner leads of the lead part.

13. The semiconductor chip stack-type package as claimed in claim 8, further comprising:
a second spacer material layer between the third semiconductor chip group and the second wiring board.

14. The semiconductor chip stack-type package as claimed in claim 1, further comprising:
a molded portion encapsulating the die paddle part, the inner leads of the lead part, the first semiconductor chip group, the second semiconductor chip group, the first wiring board and the second semiconductor chip group bonding wires.

15. A semiconductor chip stack-type package comprising:
a lead frame including a die paddle part and a lead part;
a first semiconductor chip group and a second semiconductor chip group stacked on a first surface of the die paddle part;
a third semiconductor chip group and a fourth semiconductor chip group stacked on a second surface of the die paddle part;
a first wiring board disposed between the first semiconductor chip group and the second semiconductor chip group, wherein end portions of the first wiring board are electrically connected to inner leads of the lead part;
a second wiring board disposed between the third semiconductor chip group and the fourth semiconductor chip group, wherein end portions of the second wiring board are electrically connected to the inner leads of the lead part;
first bonding wires electrically connecting the first semiconductor chip group to the inner leads of the lead part;
second bonding wires electrically connecting the second semiconductor chip group to the first wiring board;
third bonding wires electrically connecting the third semiconductor chip group to the inner leads of the lead part; and
fourth bonding wires electrically connecting the fourth semiconductor chip group to the second wiring board.

16. The semiconductor chip stack-type package as claimed in claim 15, further comprising:
a first adhesive member disposed between the inner leads of the lead part and the end portions of the first wiring board; and
a second adhesive member disposed between the end portions of the second wiring board and the inner leads of the lead part.

17. The semiconductor chip stack-type package as claimed in claim 16, further comprising:
fifth bonding wires electrically connecting the end portions of the first wiring board and the inner leads of the lead part; and
sixth bonding wires electrically connecting the end portions of the second wiring board and the inner leads of the lead part.

18. A semiconductor chip stack-type package comprising:
a lead frame including a die paddle and a lead;
a first semiconductor chip group disposed on a first surface of the die paddle and electrically connected to an upper surface of the lead;
a first wiring board disposed on the first semiconductor chip group, wherein end portions of the first wiring board are electrically connected to the upper surface of the lead;
a second semiconductor chip group disposed on the first wiring board and electrically connected to the first wiring board;
a third semiconductor chip group disposed on a second surface of the die paddle opposite to the first surface, the third semiconductor chip group electrically connected to a lower surface of the lead;
a second wiring board disposed on the third semiconductor chip group, wherein end portions of the second wiring board are electrically connected to the lower surface of the lead; and
a fourth semiconductor chip group disposed on the second wiring board and electrically connected to the second wiring board.

19. The semiconductor chip stack-type package as claimed in claim 18, further comprising:
a first conductive adhesive member electrically connecting the first wiring board to the upper surface of the lead; and
a second conductive adhesive member electrically connecting the second wiring board to the lower surface of the lead.

20. The semiconductor chip stack-type package as claimed in claim 18, further comprising:
a first non-conductive adhesive member adhering the first wiring board to the upper surface of the lead;
a first bonding wire electrically connecting the first wiring board to the upper surface of the lead;
a second non-conductive adhesive member adhering the second wiring board to the lower surface of the lead; and
a second bonding wire electrically connecting the second wiring board to the lower surface of the lead.

* * * * *